United States Patent [19]
Bond et al.

[11] Patent Number: 4,815,595
[45] Date of Patent: Mar. 28, 1989

[54] UNIFORM LEADFRAME CARRIER

[75] Inventors: Robert H. Bond; Michael A. Olla, both of Denton; Barry Morrison, Bedford; Linn C. Garrison, Dallas, all of Tex.

[73] Assignee: SGS-Thomson Microelectronics, Inc., Carrollton, Tex.

[21] Appl. No.: 170,069

[22] Filed: Mar. 14, 1988

Related U.S. Application Data

[63] Continuation of Ser. No. 937,558, Dec. 3, 1986, abandoned.

[51] Int. Cl.$^4$ .............................................. B65D 73/02
[52] U.S. Cl. ..................... 206/329; 357/75; 206/330; 29/740
[58] Field of Search ................. 357/75; 206/328, 329, 206/330, 331, 332

[56] References Cited

U.S. PATENT DOCUMENTS

| | | | |
|---|---|---|---|
| 3,385,426 | 5/1968 | May et al. | 206/330 X |
| 3,407,925 | 10/1968 | Ruehlemann | 206/328 |
| 3,469,684 | 9/1969 | Keady et al. | 29/827 X |
| 3,550,766 | 12/1970 | Nixen et al. | 206/328 |
| 3,571,920 | 3/1971 | Berg | 206/330 X |
| 4,386,463 | 6/1983 | McLaughlin | 29/740 X |
| 4,627,533 | 12/1986 | Pollard | 206/330 X |
| 4,661,886 | 4/1987 | Nelson et al. | 357/75 X |
| 4,692,790 | 9/1987 | Oyamada | 357/75 X |

FOREIGN PATENT DOCUMENTS

| | | | |
|---|---|---|---|
| 976665 | 10/1975 | Canada | 29/827 |
| 018171 | 10/1977 | Japan | 29/827 |
| 8202458 | 7/1982 | PCT Int'l Appl. | 357/75 |
| 1188451 | 4/1970 | United Kingdom | 29/827 |

*Primary Examiner*—William Price
*Attorney, Agent, or Firm*—Roland Plottel; Richard S. Roberts

[57] ABSTRACT

A leadframe carrier and insert compatible with a temperature-affectable, expandable and contractable leadframe strip to be bonded with a selected plurality of semiconductor chips, said carrier being automatically separable and removable with regard to said insert during manufacture despite possible clinging which may be induced by the expansion and contraction of said carrier insert.

6 Claims, 1 Drawing Sheet

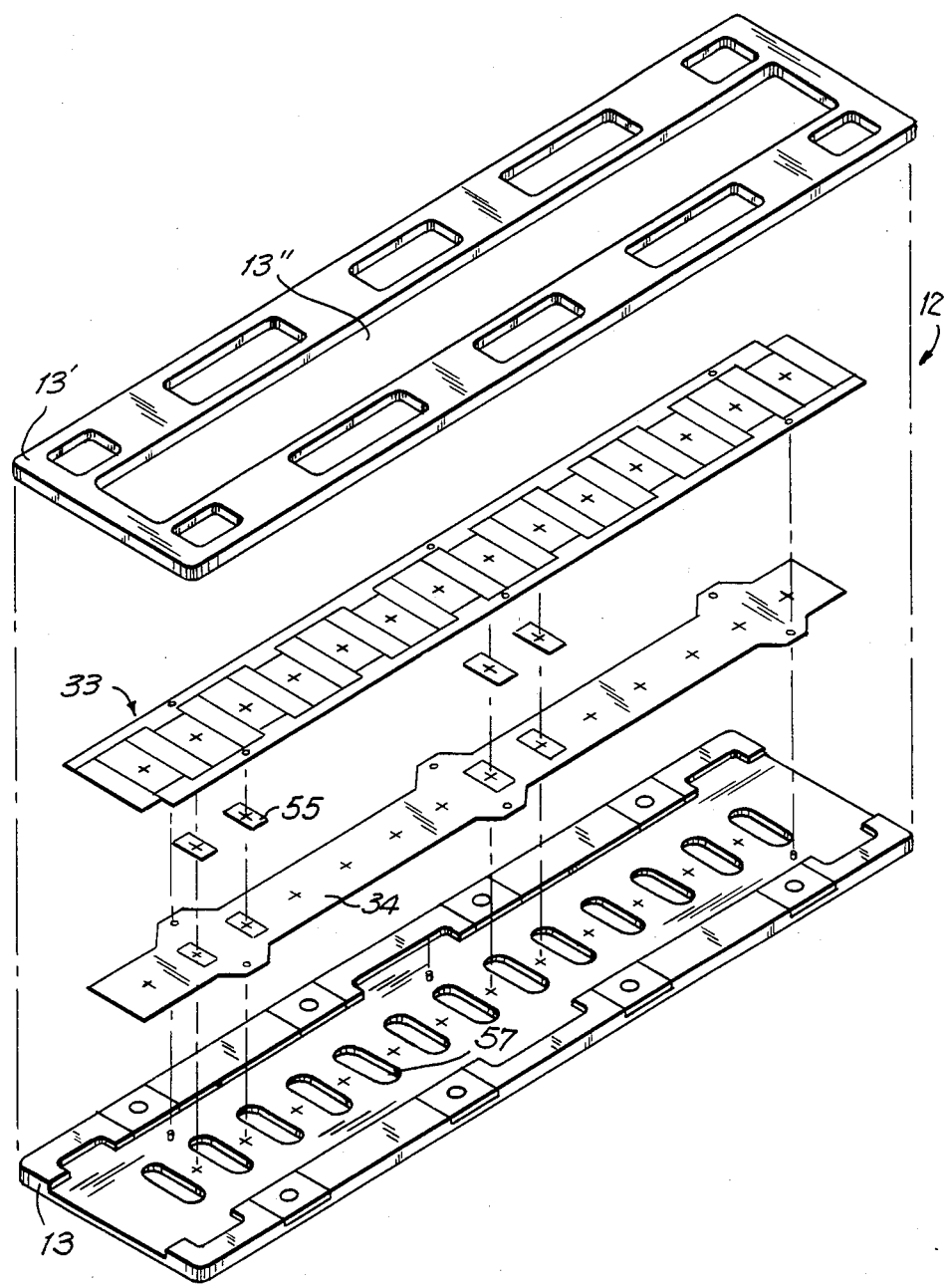

UNIFORM LEADFRAME CARRIER

This application is a continuation of application Ser. No. 937,558, filed 12/3/86.

TECHNICAL FIELD

This invention is directed toward the technical field of manufacturing semiconductor chips, and more particularly to their automated manufacture, including the automated bonding of leadframe leads to the chips.

BACKGROUND ART

In the automated manufacture and packaging of semiconductor chips, chips are made in batches instead of individually. Leadframes are typically made from strips or ribbons of flat sheets of conductive material, which is divided into a predetermined selected number of individual leadframes, each of the leadframes defining a plurality of leads sixteen (16), for example, which are bonded to pads on the semiconductor chip.

To handle these strips of leadframes during automated manufacture, it is useful to have a fixture which effectively holds individual strips of the leadframe together with the chips for bonding. One such fixture is called to leadframe carrier. These leadframe carriers can be systematically moved from station to station during manufacture on a belt or pressurized air, for example.

At present, the leadframe carrier is typically a custom device used for one particular kind of leadframe, which in turn corresponds in many cases to only a single kind or type or group of types of semiconductor chips. Accordingly, it is considered desirable to develop a leadframe carrier fixture which is conveniently adaptable to accommodate any of many different kinds of chips and leadframes.

DISCLOSURE OF INVENTION

According to the invention addressed herein, the leadframe carrier includes an insert which fits between the upper and lower portions of the main carrier assembly.

The fixture insert is made to define dimensions of length and width from a flat, rigid sheet of conductive (e.g., metallic) material. The specific material used is selected to accommodate temperature-related expansion and contraction of the leadframe material carried by the insert. According to one version of the invention, both leadframe and insert are made of a selected copper alloy. Formerly, the leadframe carrier and the leadframe itself would expand and contract with temperature by different amounts, creating a poor fit between carrier and leadframe during manufacture.

Further, a feature of the carrier insert is its being coated with a material such as Teflon, a trademark owned by DuPont. This material permits the easy, non-clinging separation of leadframe and carrier, when this is desired during manufacture.

The leadframe carrier itself has upper and lower parts which can be clamped together to hold a strip of leadframe and the insert holding the chips to be bonded to the leads of the leadframe. Clamping can for example be magnetic.

The foregoing and other objects, features and advantages of the present invention will become more apparent from the following description of the best mode for carrying out the invention and the accompanying drawing.

BRIEF DESCRIPTION OF DRAWING

The FIGURE shows isometrically in exploded view the top and bottom portions of a leadframe carrier and the chip carrying insert according to the invention herein.

BEST MODE FOR CARRYING OUT THE INVENTION

The FIGURE shows a leadframe carrier 12 including bottom and top or upper and lower, as the case may be, portions 13 and 13'. Further shown are a leadframe 33 and carrier insert 34, which is schematically indicated effectively to suggest its functional parts. Insert 34 fits into the bottom portion 13 of leadframe carrier 12.

Insert 34 holds a plurality of semiconductor chips 55 in a generally linear configuration in recesses fashioned in the top surface thereof. Semiconductor chips 55 are to be bonded onto the ends of inner leads of the leadframe 33 during manufacturing operation.

According to the invention, if chips 55 of a nonstandard or different than conventional size are to be bonded with leads from the same or a modified kind of leadframe; or if a different kind or size of leadframe is selected for bonding; then a different insert 34 according to the invention can be used with the same universal carrier.

The lower carrier portion 13 defines holes 57 in its mass which reduce its overall weight, thereby making it lighter and easier to propel during automated operations and to reduce the thermal load as seen by the reflow medium.

Further, upper portion 13' of carrier 12 defines similar weight saving apertures of its own and further define a large central aperture 13'', which permits the application of a heating vapor during manufacture, to effect the solder bonding of leads from the leadframe to pads on a corresponding semiconductor chip 55. Pins in lower portion 13 help to align and secure the leadframe during clamping together (whether magnetic or otherwise).

As shown in the Drawing, the insert defines depressions of defined size for holding semiconductor chips 55 of corresponding size insertably therein with their bonding pads upwardly disposed to meet the inner ends of leads from the leadframe. If larger (or smaller) chips are to be used instead, a different insert can be used, without requiring a new bottom portion 13 to be provided or otherwise fabricated.

As already suggested above, a single strip or ribbon of leadframe includes many individual leadframes. Each leadframe in effect contains the leads for a single chip. These leads are electrically shorted together during most of the manufacturing process, but are held together contiguously by a central perimeter from the same sheet material out of which the entire leadframe ribbon is fashioned or fabricated. The leads in effect traverse this perimeter, and those portions of the perimeter which are not part of a lead are ultimately cut away later in production.

Further, the individual chips 55 bonded to respective individual leadframes of the ribbon must of course be separated at the end of manufacturing operation.

The leads are in fact separated from one another after being encapsulated in plastic, for example, during a late state of manufacture called trim and form. This breaks up the perimeter of leadframe material which initially interconnects and holds together the leads during bonding, handling and plastic molding.

It is the end of each inner lead of the leadframe which is bonded to a corresponding contact pad on the respective chip. The outer portion of each lead in turn extends out of the package, which may be made of molded or injected plastic or ceramic material as the case may be. The outer portion of each lead is further typically bent and offset downward as for insertion into a plug or socket as the case may be.

Each semiconductor chip is thus finally packaged with an array of downwardly disposed pins for insertion into a plug or connector.

So-called leadless chip carriers are further also well known in the industry. In the case of these, no pins extend downward to meet with a mating plug or connector. Instead, the so-called leadless contacts are respectively soldered directly onto predetermined locations on a printed circuit board or chip carrier. The concepts of this invention are, however, applicable to either kind of package, leaded or leadless.

Individuals skilled in the art are likely to conceive of other versions of the invention which are nonetheless a part thereof. Accordingly, attention is directed toward the claims which follow, as these effectively and legitimately define the bounds of the invention with particularity.

What is claimed:

1. A universal leadframe carrier arrangement comprising
   (a) a leadframe carrier comprising cooperative upper and lower pieces capable of mating and defining, in combination, an inner elongated longitudinal aperture for holding a carrier insert therein; and
   (b) a carrier insert being cooperatively sandwiched between said upper and lower pieces for supporting and holding, in turn, a plurality of semiconductor chips having a predetermined size and pattern of bonding pads on a strip of leadframes to be bonded to said plurality of chips when said semiconductor chips are positioned at selected locations corresponding to the leads of said leadframe; said insert being a flat continuous strip of metallic material fabricated to predetermined dimensions of length and width to fit within said leadframe carrier for the support and correct alignment of semiconductor chips to be bonded to leads of said leadframes, said insert having at least one recess in one surface thereof, which recess is capable of having a semiconductor chip positioned therein.

2. The arrangement of claim 1 further comprising means wherein said upper and lower pieces are magnetically clampable to each other.

3. The insert of claim 1, wherein said material exhibits characteristics of expansion and contraction which are compatible with those of said leadframe, whereby the accurate alignment of leads and chips to be bonded is promoted.

4. The arrangement of claim 1, characterized in that the interior of said carrier is made of a non-clinging material.

5. The arrangement of claim 1 wherein said carrier insert is coated to reduce adhesion between the carrier insert and the leadframe.

6. The arrangement of claim 1 wherein the interior of said carrier is coated with a non-clinging material.

* * * * *